(12) United States Patent
Sakuma et al.

(10) Patent No.: US 9,490,383 B2
(45) Date of Patent: Nov. 8, 2016

(54) SOLAR MODULE

(71) Applicant: Sanyo Electric Co., Ltd., Moriguchi, Osaka (JP)

(72) Inventors: Toshiyuki Sakuma, Izumisano (JP); Tomonori Tabe, Gifu (JP); Yoshiyuki Kudo, Otsu (JP); Yosuke Ishii, Izumiotsu (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/221,977

(22) Filed: Mar. 21, 2014

(65) Prior Publication Data
US 2014/0230880 A1 Aug. 21, 2014

Related U.S. Application Data

(63) Continuation of application No. PCT/JP2012/063502, filed on May 25, 2012.

(30) Foreign Application Priority Data

Sep. 29, 2011 (JP) ................................. 2011-213704

(51) Int. Cl.
| *H01L 31/044* | (2014.01) |
|---|---|
| *H01L 31/05* | (2014.01) |
| *H01L 31/0224* | (2006.01) |
| *H01L 31/02* | (2006.01) |

(52) U.S. Cl.
CPC ....... *H01L 31/0516* (2013.01); *H01L 31/0201* (2013.01); *H01L 31/022441* (2013.01); *H01L 31/0508* (2013.01); *H01L 31/0512* (2013.01); *Y02E 10/50* (2013.01)

(58) Field of Classification Search
CPC ....... H01L 31/00–31/078; Y02E 10/50–10/60
USPC .................................... 136/243–265
See application file for complete search history.

(56) References Cited

U.S. PATENT DOCUMENTS

| 2007/0295381 | A1* | 12/2007 | Fujii | ............... | H01L 31/022433 136/244 |
|---|---|---|---|---|---|
| 2011/0017281 | A1* | 1/2011 | Funakoshi et al. | ........... | 136/251 |
| 2011/0155203 | A1* | 6/2011 | Funakoshi | .................... | 136/244 |

FOREIGN PATENT DOCUMENTS

| JP | 2009-043842 A | 2/2009 |
|---|---|---|
| JP | WO2009019940 | * 2/2009 |

* cited by examiner

*Primary Examiner* — Bach Dinh
(74) *Attorney, Agent, or Firm* — Mots Law, PLLC

(57) ABSTRACT

A solar module is provided which has improved durability. A third wiring member (32*a*) includes a first portion (32*a*1), a second portion (32*a*2), and a third portion (32*a*3). In the first portion (32*a*1), metal foil (52) faces a solar cell (20). The first portion (32*a*1) is electrically connected to the solar cell (20). The second portion (32*a*2) is arranged on the solar cell (20) with the metal foil (52) facing the side opposite to the solar cell (20). The third portion (32*a*3) connects the first portion (32*a*1) and the second portion (32*a*2). A first wiring member (32*b*) electrically connects the second portions (32*a*2) of adjacent solar cell strings (10) to each other. The solar module (1) also includes an insulating sheet (60). The insulating sheet (60) is arranged between the first wiring member (32*b*) and the solar cell (20).

8 Claims, 4 Drawing Sheets

SOLAR MODULE

CROSS-REFERENCE TO RELATED APPLICATIONS

This is a continuation of International Application PCT/JP2012/063502, with an international filing date of May 25, 2012, filed by applicant, the disclosure of which is hereby incorporated by reference in its entirety.

FIELD OF THE INVENTION

The present invention relates to a solar module.

BACKGROUND

Solar modules with back contact solar cells are conventionally known to be solar modules with improved photoelectric conversion efficiency. An example is described in Patent Document 1. The solar module described in Patent Document 1 includes a plurality of circuit boards with wiring provided on the surface. The back contact solar cells are arranged in one direction on the circuit boards. The solar cells are connected electrically to the wiring of the circuit boards. The circuit boards are arranged in another direction which is perpendicular to the one direction. Circuit boards adjacent to each other in the other direction are connected electrically via conductive members.

PRIOR ART DOCUMENTS

Patent Documents

Patent Document 1: Laid-Open Patent Publication No. 2009-43842

SUMMARY

Problem Solved by the Invention

In recent years, there has been growing demand for solar modules with improved durability.

It is an object of the present invention to provide a solar module with improved durability.

Means of Solving the Problem

The solar module of the present invention includes a plurality of solar cell strings and a first wiring member. The solar cell strings are arranged in the one direction. The first wiring member is used to electrically connect adjacent solar cell strings to each other. The first wiring member is composed of metal foil. Each solar cell string has a plurality of solar cells, a second wiring member, and a third wiring member. The solar cells are arranged in another direction inclined with respect to the one direction. The second wiring member is bonded to the end portions of each of the adjacent solar cells. The second wiring member is used to connect adjacent solar cells to each other. The third wiring member is electrically connected to the end portion in the other direction of the solar cell positioned at the very end of the solar cells in the other direction. The third wiring member has resin film and metal foil arranged on the resin film. The third wiring member includes a first portion, a second portion, and a third portion. In the first portion, the metal foil faces the solar cell. The first portion is connected electrically to the solar cell. The second portion is provided on the solar cell with the metal foil facing the side opposite to the solar cell. The third portion connects the first portion and the second portion. The first wiring member is used to electrically connect the second portions of adjacent solar cell strings to each other. The solar module of the present invention also includes an insulating sheet. The insulating sheet is arranged between the first wiring member and the solar cell.

Effect of the Invention

The present invention is able to provide a solar module with improved durability.

DETAILED DESCRIPTION

Figure 1:
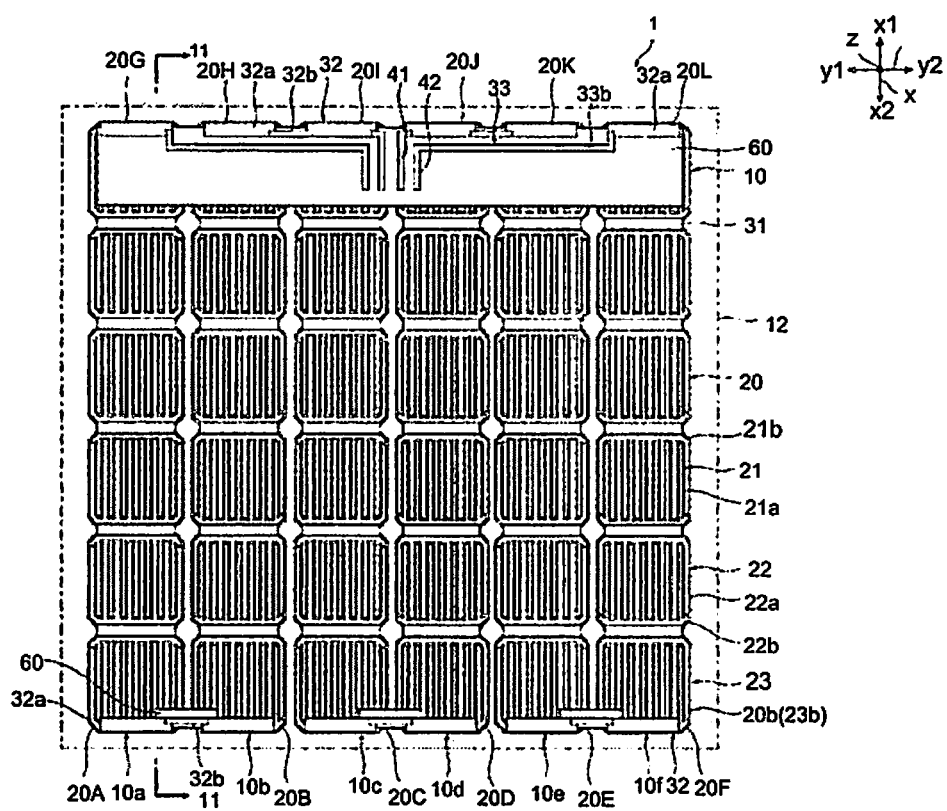
FIG. 1 is a simplified back view of a solar module in an embodiment of the present invention.

The following is an explanation of examples of preferred embodiments of the present invention. The following embodiments are merely examples. The present invention is not limited by the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

Figure 2:
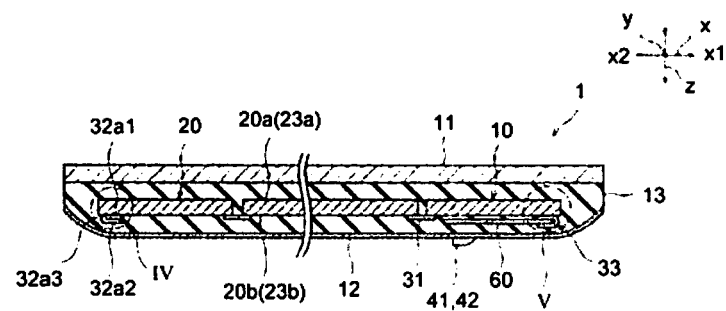
FIG. 2 is a simplified cross-sectional view from line II-II in FIG. 1.

As shown in FIG. 1 and FIG. 2, the solar module 1 is provided with a plurality of solar cell strings 10 each having a plurality of solar cells 20. More specifically, the solar module 1 includes a first through sixth solar cell string 10a-10f. As shown in FIG. 2, the solar cell strings 10 are arranged between a first protecting member 11 and a second protecting member 12. The first protecting member 11 is positioned on the side with the light-receiving surfaces 20a of the solar cells 20. The second protecting member 12 is positioned on the side with the back surfaces 20b of the solar cells 20. The second protecting member 12 is flexible. A sealing material layer 13 is provided between the first protecting member 11 and the second protecting member 12. The solar cells 20 are sealed by the sealing material layer 13.

The first protecting member 11 can be composed of a translucent member such as a resin substrate. The second protecting member 12 can be composed of a flexible member such as a resin sheet or a resin sheet containing interposed metal foil. The sealing material layer 13 can be composed of ethylene-vinyl acetate copolymer (EVA), polyvinyl butyral (PVB), polyethylene (PE), or polyurethane (PU). The sealing material layer 13 preferably contains a non-crosslinked resin.

Figure 3:
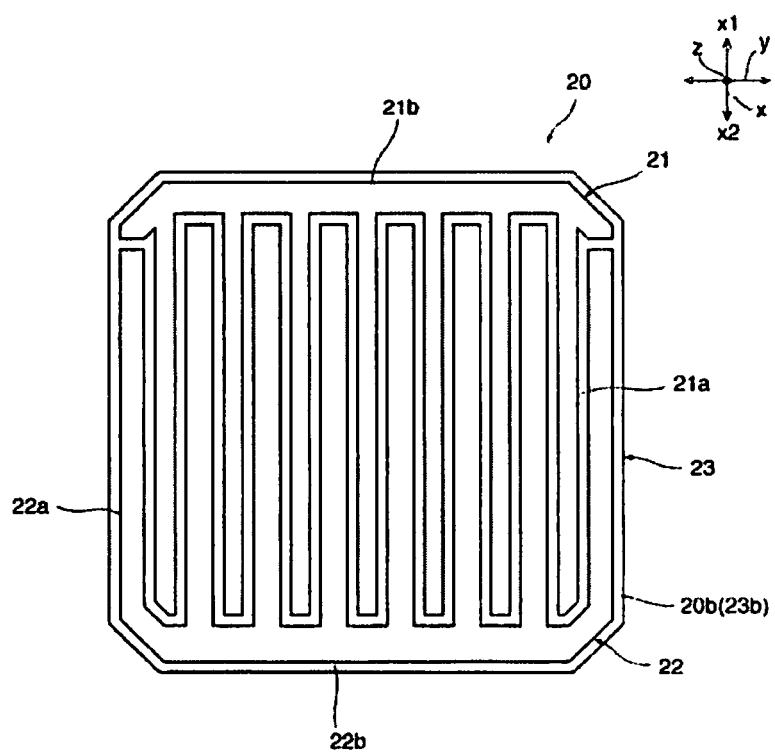
FIG. 3 is a simplified back view of a solar module in an embodiment of the present invention.

Each of the solar cell strings 10 has a plurality of solar cells 20 arranged in the x-axis direction, which is inclined with respect to (usually perpendicular to) the y-axis direction or the direction in which the solar cell strings 10 are arranged. As shown in FIG. 1 and FIG. 3, each solar cell 20 has a photoelectric conversion unit 23, and first and second electrodes 21, 22.

The photoelectric conversion unit 23 has first and second main surfaces 23a, 23b. The first main surface 23a of the photoelectric conversion unit 23 constitutes the light-receiving surface 20a of the solar cell 20, and the second main surface 23b constitutes the back surface 20b of the solar cell 20.

A photoelectric conversion unit 23 is a member that generates carriers such as holes and electrons when exposed to light. The photoelectric conversion unit 23 may generate carriers when exposed to light only on the first main surface 23a, or may generate carriers when exposed to light not only on the first main surface 23a but also on the second main surface 23b. In other words, the solar cells 20 may be bifacial solar cells.

There are no particular restrictions on the type of photoelectric conversion unit 23 that is used. The photoelectric conversion unit 23 can, for example, be composed using a crystalline silicon substrate.

A first electrode 21 for collecting one of either electrons or holes and a second electrode 22 for collecting the other of either electrons or holes are arranged on the second main surface 23b of the photoelectric conversion unit 23. In other words, the solar cells 20 are back contact solar cells.

There are no particular restrictions on the shape of either the first electrode 21 or the second electrode 22. In the present invention, both the first electrode 21 and the second electrode 22 are comb-shaped. The first electrode 21 and the second electrode 22 are interdigitated. More specifically, the first electrode 21 and the second electrode 22 both have a plurality of finger portions 21a, 22a and a busbar portion 21b, 22b. Each of the finger portions 21a, 22a extends in the x-axis direction. Finger portions 21a, 22a are arranged at a predetermined interval in the y-axis direction, which is perpendicular to the x-axis direction.

The finger portions 21a are connected electrically to busbar portion 21b. Busbar portion 21b is arranged on one side (the x1 side) of the finger portions 21a in the x-axis direction. Busbar portion 21b is provided from one end to the other in the y-axis direction on the x1 end portion of the solar cell 20 in the x-axis direction.

Similarly, the finger portions 22a are connected electrically to busbar portion 22b. Busbar portion 22b is arranged on one side (the x2 side) of the finger portions 22a in the x-axis direction. Busbar portion 22b is provided from one end to the other in the y-axis direction on the x2 end portion of the solar cell 20 in the x-axis direction.

As shown in FIG. 1, adjacent solar cells 20 in the x-axis direction are connected electrically using a wiring member 31 in each of the solar cell strings 10. More specifically, the first electrode 21 of one of the solar cells 20 adjacent to each other in the x-axis direction is connected electrically by a wiring member 31 to the second electrode 22 of the other solar cell 20.

The wiring member 31 can be composed of metal foil, a metal foil laminate, metal foil whose surface is coated with solder, or a flexible printed circuit (FPC) board having an insulating film and wiring arranged on the insulating film. The metal foil and the wiring can be made of Ag or Cu.

The wiring member 31 and the back surface 20b of a solar cell 20 are bonded via an adhesive layer (not shown). The adhesive layer can be composed of a cured resin adhesive, a cured resin adhesive containing a dispersed conductive material, or solder. The wiring member 31 is bonded to the end portion of the solar cell 20 in an x-axis direction. More specifically, the wiring member 31 is bonded only to the end portion of the solar cell 20 in an x-axis direction.

The first through sixth solar cell strings 10a-10f are connected electrically via a wiring member 32. More specifically, the solar cell 20A at the farthest x2 end of the first solar cell string 10a, the solar cell 20B at the farthest x2 end of the second solar cell string 10b, the solar cell 20C at the farthest x2 end of the third solar cell string 10c, the solar cell 20D at the farthest x2 end of the fourth solar cell string 10d, the solar cell 20E at the farthest x2 end of the fifth solar cell string 10e, and the solar cell 20F at the farthest x2 end of the sixth solar cell string 10f are each connected electrically by a wiring member 32. The wiring member 32 electrically connects the first electrodes 21 of solar cells 20A, 20C and 20E to the second electrodes 22 of solar cells 20B, 20D and 20F.

In addition, the solar cell 20H at the farthest x1 end of the second solar cell string 10b, the solar cell 20I at the farthest x1 end of the third solar cell string 10c, the solar cell 20J at the farthest x1 end of the fourth solar cell string 10d, and the solar cell 20K at the farthest x1 end of the fifth solar cell string 10e are connected electrically by a wiring member 32. The wiring member 32 electrically connects the first electrode 21 of solar cells 20H and 20J to the second electrode 22 of solar cells 20I and 20K.

A portion of wiring member 32 electrically connecting solar cells 20H and 20I, and a portion of wiring member 32 electrically connecting solar cells 20J and 20K create a first extraction electrode 41. As shown in FIG. 2, the first extraction electrode 41 is drawn from the sealing material layer 13 and, more specifically, the solar module 1. More specifically, the tip of the first extraction electrode 41 is drawn from the second protecting member 12.

The wiring member 32 is actually composed of two wiring members 32a and wiring member 32b. The two wiring members 32a are bonded via an adhesive layer 40 to the solar cell 20, and are connected electrically to the first electrode 21 or the second electrode 22. Wiring member 32b is connected electrically to the two wiring members 32a. Wiring member 32a is arranged in the y-axis direction perpendicular to the x-axis direction from the y1 end to the y2 end of the end portion of the solar cell 20 in the x-axis direction. The wiring member 32a is connected electrically to the solar cell at the far end in the x-axis direction of the solar cells 20 constituting a solar cell string 10.

Figure 4:
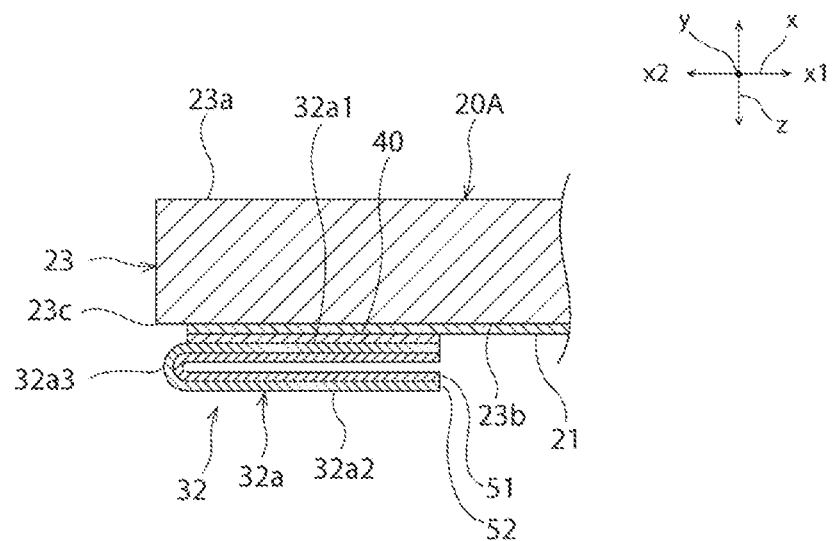
FIG. 4 is a simplified cross-sectional view of the solar cell string in section IV of FIG. 2.
Figure 5:
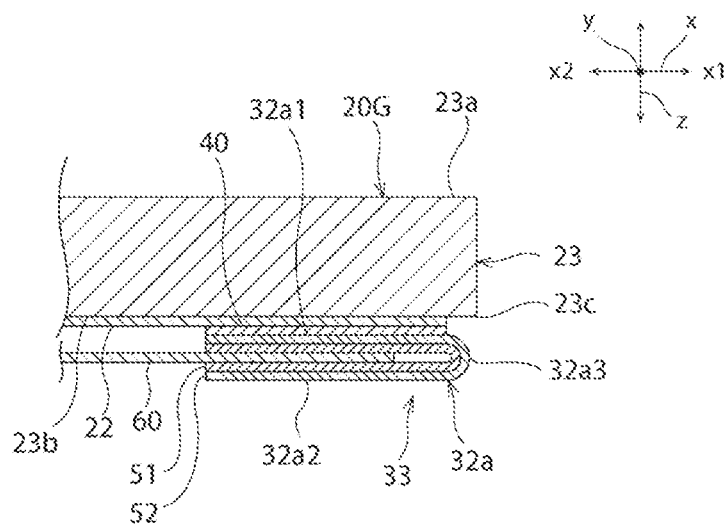
FIG. 5 is a simplified cross-sectional view of the solar cell string in section V of FIG. 2.

As shown in FIG. 4, the wiring member 32a is composed of a flexible printed circuit board having a resin film 51 and wiring 52. The resin film 51 can be made of a resin such as polyimide (PI) or polyethylene terephthalate (PET). The wiring 52 is arranged on the resin film 51. The wiring 52 is connected electrically to the first electrode 21 or the second electrode 22. The wiring 52 can be composed of metal foil made of at least one type of metal such as Cu or Ag.

The wiring member 32a has a first portion 32a1, a second portion 32a2 and a bent portion 32a3. The first portion 32a1 constitutes one end of the wiring member 32a. The first portion 32a1 is arranged so that the wiring 52 faces the solar cell 20. The first portion 32a1 is bonded to the back surface 20b of the solar cell 20.

The second portion 32a2 constitutes the other end of the wiring member 32a. The second portion 32a2 is arranged so that the wiring 52 faces the side opposite to the solar cell 20. At least a section of the second portion 32a2 is arranged on the first portion 32*a*1. In other words, at least a section of the second portion 32*a*2 overlaps with the first portion 32*a*1 in the z-axis direction, which is the thickness direction of the solar cell 20.

The bent portion 32*a*3 is connected to the first portion 32*a*1 and the second portion 32*a*2. The bent portion 32*a*3 has a bent structure. In the bent portion 32*a*3, the wiring 52 faces outside. The bent portion 32*a*3 is arranged on the back surface 20*b* of the solar cell 20. In other words, the bent portion 32*a*3 overlaps with the solar cell 20 in the z-axis direction. The bent portion 32*a*3 is formed by bending a flat wiring member.

Wiring member 32*b* is connected electrically to the wiring 52 of the wiring member 32*a* in the second portion 32*a*2. In other words, the wiring member 32*b* connects the second portions 32*a*2 of solar cell strings 10 adjacent to each other in the y-axis direction. The wiring member 32*b* is arranged so as to overlap with the second portion 32*a*2 in the x-axis direction. The wiring member 32*b* may be bonded to the wiring member 32*a* using a resin adhesive. In the present invention, it is bonded to the wiring member 32*a* using solder and is connected electrically to the wiring 52 of the wiring member 32*a*. The wiring member 32*b* is bonded to a portion of the wiring member 32*a* in the y-axis direction. The ratio of the length of the portion of wiring member 32*a* bonded to wiring member 32*b* in the y-axis direction relative to the length of wiring member 32*a* in the y-axis direction ((length of wiring member 32*a* bonded to wiring member 32*b* in the y-axis direction)/(length of wiring member 32*a* in y-axis direction)) is preferably from 1/10 to 1, and more preferably from 1/10 to 1/2.

A portion of wiring member 32*b* constitutes extraction electrode 41 and is drawn from the solar module 1.

In the present invention, the wiring member 32*b* is composed of metal foil of at least one type of metal such as Cu or Ag. The thickness of the wiring member 32*b* is greater than the thickness of the wiring 52. The thickness of the wiring member 32*b* is two or more times greater, and preferably 5 or more times greater, than the thickness of the wiring 52.

The second electrode 22 of the solar cell 20G at the farthest x1 end of the first solar cell string 10*a* and the first electrode 21 of the solar cell 20L at the farthest x1 end of the sixth solar cell string 10*f* are connected electrically by wiring member 33. Solar cells 20G and 20L are bonded to the wiring member 33 via an adhesive layer 40.

Wiring member 33 has wiring member 32*a* and wiring member 33*b*. The wiring member 32*a* constituting a portion of wiring member 33 has a configuration that is substantially similar to the wiring member 32*a* constituting a portion of wiring member 32. Wiring member 32*a* constituting a portion of wiring member 33 is bonded and connected electrically to the second electrode 22 of solar cell 20G and the first electrode 21 of solar cell 20L.

Wiring member 33*b* is connected electrically to wiring member 32*a* constituting a portion of wiring member 33. A portion of wiring member 33*b* constitutes extraction electrode 42. The extraction electrode 42 is drawn from the sealing material layer 13, more specifically, from the solar module 1.

The wiring member 33*b* is connected electrically to the wiring 52 in the second portion 32*a*2 of the wiring member 32*a* constituting a portion of wiring member 33. The wiring member 33*b* may be bonded to the wiring member 32*a* using a resin adhesive. However, in the present embodiment, it is bonded to the wiring member 32*a* using solder and connected electrically to the wiring 52 of the wiring member 32*a*. The wiring member 33*b* is bonded to a portion of the wiring member 32*a* in the y-axis direction.

In the present embodiment, the wiring member 33*b* is composed of metal foil made of at least one type of metal such as Cu and Ag. The thickness of the wiring member 33*b* is greater than the thickness of the wiring 52. The thickness of the wiring member 33*b* is 2 or more times greater, and preferably 5 or more times greater, than the thickness of the wiring 52.

An insulating sheet 60 is arranged between the back surface 20*b* of the solar cell 20 and the wiring members 32*b*, 33*b* and extraction electrodes 41, 42 made of metal foil. This can prevent shorting of the wiring members 32*b*, 33*b*, the extraction electrodes 41, 42 and the electrodes 21, 22. The insulating sheet 60 can be made of the PI or PET resin used in the resin film 51 or can be made of EVA, PVB, PE or PU resin used in the sealing material layer 13. The insulating sheet arranged between the wiring members 32*b*, 33*b* and the solar cell 20 can be separate from the insulating sheet arranged between the extraction electrodes 41, 42 and the solar cell 20.

Here, the thermal expansion coefficient of the printed circuit board is different from the thermal expansion coefficient of the solar cell. As in the solar module described in Patent Document 1, this makes it so that a circuit board and a solar cell easily delaminate when the entire surface of a back contact solar cell is bonded to a circuit board.

In the solar module 1, the wiring member 31 is not bonded to the entire surface of a solar cell 20 but only to the end portion of the solar cell 20 in the x-axis direction. In this way, it is difficult for a large amount of stress to occur between the wiring member 31 and the solar cell 20 when the temperature of the solar module 1 changes. This makes delamination of the wiring member 31 and the solar cell 20 less likely to occur.

Similarly, the wiring member 32*a* is connected electrically to a solar cell 20 at the end portion of the solar cell 20 in the x-axis direction. The second portions 32*a*2 of wiring members 32*a* in solar cell strings 10 arranged adjacent to each other in the y-axis direction are connected to each other electrically via a wiring member 32*b* of metal foil. An insulating sheet 60 is arranged between the wiring member 32*b* and the solar cells 20. The insulating sheet 60 insulates the wiring member 32*b* and the solar cells 20. When this configuration is used, it is difficult for a large amount of stress to occur between the wiring member 32*b* and the solar cells 20 when the temperature of the solar module 1 changes. This makes delamination of the wiring member 32*b* and the solar cell 20 less likely to occur. As a result, a solar module 1 with improved durability can be realized.

In a configuration in which two wiring members 32*a* are connected via a wiring member 32*b*, a portion of a wiring member 32*b* may come into contact with the first electrode 21 or the second electrode 22 of the solar cell 20. In order to prevent current leakage due to contact, an insulating sheet may be provided between the wiring member 32*b* and the solar cell 20. However, when an insulating sheet is provided in this portion, a level difference occurs between the region in which wiring member 32*a* is provided and the region in which wiring member 32*b* is provided, and the wiring member 32*b* connected to wiring member 32*a* may come off. This is likely to occur when the solar cells 20 are sealed inside the sealing material layer 13.

In the present embodiment, an insulating sheet 60 is provided not only in the region in which wiring member 32*b* is provided but also in the region in which wiring member 32*a* is provided. As a result, the connection reliability between wiring member 32a and wiring member 32b can be improved while insulating wiring member 32b and the solar cell 20.

When this configuration is used, the size of the insulating sheet 60 can be reduced. In this solar module 1, the wiring member 32b is provided so as to overlap with the second portion 32a2 in the x-axis direction. As a result, the length of the region in which the second portion 32a2 and the wiring member 32b are provided can be reduced in the x-axis direction. This further reduces the size of the insulating sheet 60. The manufacturing costs of the solar module 1 can be lowered by reducing the size of expensive insulating sheets 60.

Figure 6:
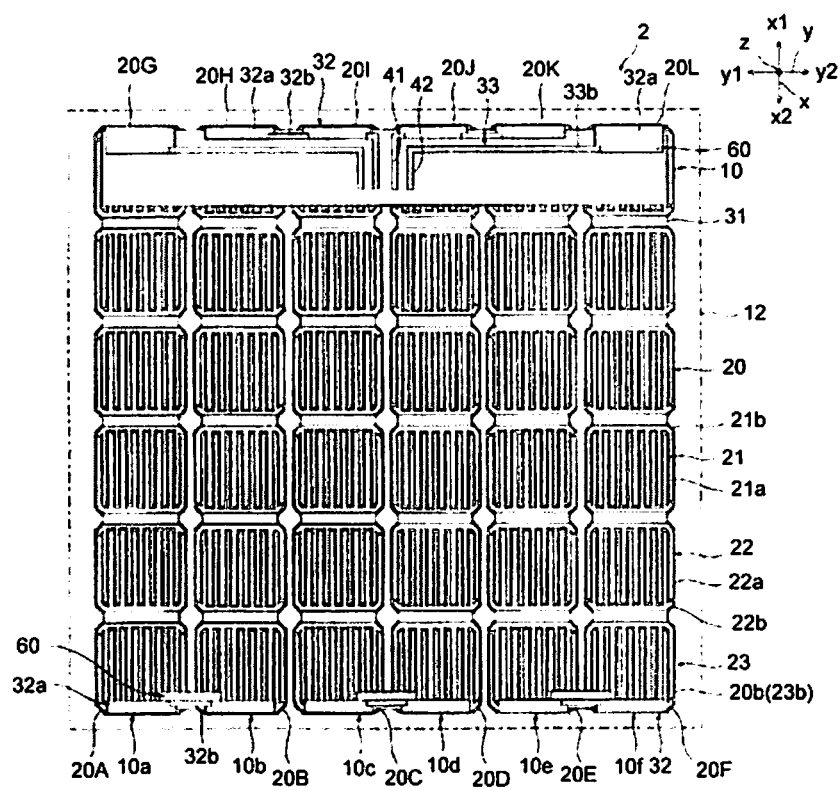
FIG. 6 is a simplified back view of the solar module in a modified example.

In solar module 1, the length of the second portions 32a2 in the x-axis direction of solar cell strings 10a and 10f positioned to the outside in the y-axis direction is the same as the length of the second portions 32a2 in the x-axis direction of solar cell strings 10b-10e positioned in the center in the y-axis direction. However, as shown in FIG. 6, the solar cell strings 10 of solar module 2 include solar cell strings 10 whose second portions 32a2 have different lengths in the x-axis direction. More specifically, the length of the second portions 32a2 in the x-axis direction of solar cell strings 10a and 10f positioned to the outside in the y-axis direction is different from the length of the second portions 32a2 in the x-axis direction of solar cell strings 10b-10e positioned in the center in the y-axis direction. The extraction electrode 42 is connected electrically to the longer second portions 32a2 of solar cell strings 10b-10e in a portion closer to the center of the solar cell module 2 than the shorter second portions 32a2 of the solar cell strings 10a, 10f. The portion of the extraction electrode 42 on the side with the second portion 32a2 extends away from the second portion 32a2 in the y-axis direction. Unlike solar module 1, solar module 2 does not require a bent portion in the portion of the extraction electrode 42 on the side with the second portion 32a2. This reduces manufacturing costs associated with the extraction electrode 42. As a result, the manufacturing costs of the solar module 2 can be reduced.

The present invention includes various embodiments not described herein. For example, the first and second electrodes may be busbarless electrodes which have finger portions but no busbar portion.

A solar module may also include a single solar cell.

The present invention includes many other embodiments not described herein. Therefore, the technical scope of the present invention is defined solely by the items of the invention specified in the claims pertinent to the above explanation.

KEY TO THE DRAWINGS

1: Solar module
10, 10a-10f: Solar cell strings
11: 1st protecting member
12: 2nd protecting member
13: Sealing material layer
20, 20A-20L: Solar cells
20a: Light-receiving surface
20b: Back surface
21: 1st electrode
22: 2nd electrode
23: Photoelectric conversion unit
31-33, 32a, 32b, 33b: Wiring members
32a1: 1st portion
32a2: 2nd portion
32a3: Bent portion 51: Resin film
52: Wiring
60: Insulating sheet

What is claimed is:

1. A solar module comprising a plurality of solar cell strings arranged in a first direction, and
   a first wiring member of metal foil electrically connecting adjacent solar cell strings to each other,
   each solar cell string having
   a plurality of solar cells arranged in a second direction inclined with respect to the first direction, the plurality of solar cells including a terminal solar cell located at an end of the plurality of solar cells in the second direction,
   a second wiring member bonded to end portions of adjacent solar cells to electrically connect the adjacent solar cells to each other, and
   a third wiring member having resin film and metal foil arranged on the resin film, and electrically connected to an end portion in the second direction of the terminal solar cell,
   the third wiring member including
   a first portion connected electrically to the terminal solar cell with the metal foil facing the terminal solar cell,
   a second portion arranged with the metal foil facing away from the terminal solar cell, and
   a third portion connecting the first portion and the second portion,
   the first wiring member electrically connecting the second portion of the third wiring member of the solar cell string and the second portion of the third wiring member of adjacent solar cell string to each other,
   an insulating sheet between the first portion of each third wiring member and the second portion of each third wiring member,
   when viewed in a normal direction of a light-receiving surface of the plurality of solar cells, the third portion of the third wiring member is inside the plurality of solar cells such that the end portion in the second direction of the terminal solar cell is outside of an end portion in the second direction of the insulating sheet.

2. The solar module according to claim 1, wherein the first wiring member overlaps with the second portion of the third wiring member in the second direction.

3. The solar module according to claim 1, further comprising a sealing material for sealing the plurality of solar cell strings and the first through third wiring members,
   an extraction electrode connected electrically to the third portion and drawn to the outside of the sealing material, and
   another insulating sheet between the extraction electrode and the plurality of solar cells.

4. The solar module according to claim 3, wherein the plurality of solar cell strings include solar cell strings having second portions of different lengths in the second direction,
   the extraction electrode is connected to a longer second portion closer to the center of the solar module than a shorter second portion, and
   the extraction electrode has a portion extending in the first direction from the longer second portion.

5. The solar module according to claim 3, wherein the first portion is disposed along a first plane substantially parallel substantially to a second plane on which the second portion is disposed,
   the insulating sheet is disposed along a third plane substantially parallel to the first plane and the second plane, and the first plane, the second plane and the third plane are different from each other.

6. The solar module according to claim 5, wherein the extraction electrode is disposed along a fourth plane substantially the same as the second plane on which the second portion is disposed.

7. The solar module according to claim 1, wherein the insulating sheet is between the first wiring member and the solar cell.

8. The solar module according to claim 1, wherein at the third portion of the third wiring member, the metal foil is disposed on an entire surface of the resin film.

\* \* \* \* \*